United States Patent
Le Roy et al.

(10) Patent No.: US 7,115,426 B2
(45) Date of Patent: Oct. 3, 2006

(54) METHOD AND APPARATUS FOR ADDRESSING THICKNESS VARIATIONS OF A TRENCH FLOOR FORMED IN A SEMICONDUCTOR SUBSTRATE

(75) Inventors: Erwan Le Roy, Newark, CA (US); Patricia Le Coupanec, Newark, CA (US); Theodore R. Lundquist, Dublin, CA (US); William B. Thompson, Los Altos, CA (US); Mark A. Thompson, Austin, TX (US); Lokesh Johri, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 11/031,423

(22) Filed: Jan. 7, 2005

(65) Prior Publication Data

US 2006/0030064 A1    Feb. 9, 2006

Related U.S. Application Data

(60) Provisional application No. 60/599,213, filed on Aug. 5, 2004.

(51) Int. Cl.
*H01L 21/66* (2006.01)
(52) U.S. Cl. .............. 438/16; 438/5; 438/14; 438/16; 438/700; 438/712; 438/FOR. 117
(58) Field of Classification Search .......... 438/14, 438/5, 16, 700, 712; 702/166
See application file for complete search history.

(56) References Cited

U.S. PATENT DOCUMENTS

| | | | | |
|---|---|---|---|---|
| 4,717,681 A | * | 1/1988 | Curran | 438/314 |
| 5,578,161 A | * | 11/1996 | Auda | 438/9 |
| 5,616,921 A | | 4/1997 | Talbot et al. | 250/307 |
| 5,724,144 A | * | 3/1998 | Muller et al. | 356/632 |
| 6,225,626 B1 | * | 5/2001 | Talbot et al. | 250/307 |
| 6,955,930 B1 | * | 10/2005 | Le Roy et al. | 438/16 |
| 2003/0165749 A1 | * | 9/2003 | Fritze et al. | 430/5 |
| 2003/0224543 A1 | * | 12/2003 | Roy et al. | 438/16 |
| 2005/0236583 A1 | * | 10/2005 | Roy et al. | 250/492.1 |

OTHER PUBLICATIONS

Cryan et al. (Modelling and Measurement of 2D Photonic Crystals with Tapered Hole Profiles, Proceedings of 2003 5th inter Conference on Transparent Optical Networks, Jun. 29-Jul. 3, 2003, vol. 1 pp. 344-347).*

Kaushal Verma and Bongtae Han, "Sensitivity Enhancement of Far-Infrared Fizeau Interferometry by Digital Image Processing", Opt. Eng. 40(9), Sep. 2001, pp. 1970-1977.

* cited by examiner

*Primary Examiner*—Matthew Smith
*Assistant Examiner*—Jarrett J. Stark
(74) *Attorney, Agent, or Firm*—Deborah W. Wenocur (57) ABSTRACT

A method for utilizing interference fringe patterns generated when milling a trench through a semiconductor substrate by a method such as FIB milling, to determine and optimize the thickness uniformity of the trench bottom. The interference fringes may be mapped and the mapping used to direct the FIB milling to those regions which are thicker to correct observed non-uniformities in the trench floor thickness by varying the pixel dwell time across the milled area. The interference fringe mapping may be used to develop computerized contour lines to automate the pixel dwell time variations as described above, for correcting non-uniformities in the trench floor thickness. The method may be applied to applications other than trench formation for backside editing, such as monitoring progress in forming a milled object.

19 Claims, 6 Drawing Sheets

METHOD AND APPARATUS FOR ADDRESSING THICKNESS VARIATIONS OF A TRENCH FLOOR FORMED IN A SEMICONDUCTOR SUBSTRATE

CROSS-REFERENCE TO RELATED APPLICATION

This application claims priority from U.S. Provisional Application No. 60/599,213, filed Aug. 5, 2004.

FIELD OF THE INVENTION

This disclosure pertains to semiconductor technology and more specifically to etching a trench through a semiconductor substrate of an integrated circuit so as to access, from the backside of the substrate, active regions or interconnection metal layers formed on the opposing principal surface of the substrate, the trenching process using a focused ion beam.

BACKGROUND OF THE INVENTION

It is well known to use a focused ion beam (FIB) for exposing conductors on an integrated circuit (IC) to aid in debug, or failure analysis, and editing of the integrated circuit. See for instance U.S. Pat. No. 6,225,626, issued May 1, 2001, to Talbot et al.; U.S. Pat. No. 5,140,164, issued Aug. 18, 1992 to Talbot et al.; and U.S. Pat. No. 5,616,921, issued Apr. 1, 1997 to Talbot et al., all incorporated herein by reference in their entireties. U.S. Pat. No. 6,225,626 discloses methods for exposing a selected feature of an IC such as a selective conductor, from the backside of the IC substrate without disturbing adjacent features of the device, such as the active (semiconductor) regions. The method includes determining a region of the IC in which the selected feature is located; obtaining from the backside of the IC substrate a near IR (infra-red) optical microscope image of the region; aligning the optical microscope image with a coordinate system of a milling (FIB) system; and using structures visible in the near IR microscope image as a guide (also described in U.S. application Ser. No. 10/159,527 by Madhumita Sengupta and Mamta Sinha), operating the milling system to expose the selected feature from the backside of the IC without disturbing adjacent features.

Other aspects of this approach include forming the trench through the backside of the substrate where the trench may be stepped in cross-section, and milling down most of the way through the substrate from the backside surface thereof to just above the substrate circuit elements. Following this an access hole is milled to to expose ILD0 and the metal interconnections (circuitry) typically formed overlying the principal surface of the substrate. The focused ion beam is then used to cut or reform various portions of these metal layers in order to reconnect the transistors formed within the substrate. This operation requires the local isolation of the routed interconnect prior to its construction by means of the deposition of a dielectric layer, as is described in U.S. Pat. No. 5,357,116 by Talbot et al. issued Oct. 18, 1994. This is used typically for failure analysis, debug, and edit (rework) of ICs. It is most typically used in the research and development and manufacturing engineering stages, but is applicable to the reworking or discretionary rewiring of actual production ICs. This is described in Crawford and PE Kudirka, "Electron Microbeam Testing for Large Microcircuit Arrays" IEEE-Proceedings of the Symposium on Electron, Ion and Laser Beam Technology (1971) 131–140. Credence, assignee of this application and of the above-referenced patents, produces commercially available FIB systems, such as the IDS P3Xd instrument and the IDS OptiFIB instrument. A FIB system typically includes a source of ions, such as gallium ions, suitable magnetic and/or electric lenses for focusing the ion beam, and also a chemical source, injected to enhance milling, such as xenon difluoride ($XeF_2$). The OptiFIB includes the focused ion beam column coaxial with a light microscope for optical observation of the milling process when using near infra-red (as described in US Patent Publication number U.S. 20030102436A1), and for navigation (finding specific locations) across the IC die.

It has been recognized by the present inventors that prior to performing the final circuit editing operations (cutting and/or filling in of the metal layers), the edit is generally more successful if the access trench itself which is formed on the backside surface of the substrate is etched precisely so that the remaining silicon thickness is uniform across the trench floor. In most applications the trench does not extend all the way through the substrate; instead, it extends to within, for instance, 2 to 5 µm of the principal surface of the substrate, leaving an intervening thin layer of, e.g., silicon. The reason for this is that in advanced ICs, the transistor density on the principal surface leaves no room for very large trenching operations. The actual circuit editing is generally performed through this thin layer by the FIB. For instance, a 30 KeV gallium ion beam, assisted by a chemistry such as xenon difluoride ($XeF_2$), or alternatively with a chemistry less aggressive to silicon such as chemicals containing iodine, bromine, or chlorine, can mill a small via (cavity) through the trench floor by locally removing the last few microns of silicon, and can then add dielectric and conductor, thereby performing the circuit (metal layer) edit.

Since this silicon layer is the floor of the trench formed from the backside surface-of the substrate, the present inventors have determined that the floor of the trench should be nearly perfectly flat (smooth) and parallel to the principal surface of the substrate; i.e., it is preferable if during the trenching process the remaining silicon has uniform thickness. A non-uniform trench floor may locally enhance the spontaneous etching, which may result in penetration of the ion beam through the silicon into the device active areas and lead to inaccuracy in the circuit edit. Operations such as the automation of edit steps (see for instance U.S. Pat. No. 6,031,229 by Keckley et al., issued Feb. 29, 2000) would depend on this uniformity. Additionally, non-uniformity affects the aspect ratio of the access hole milled through the remaining silicon, and may ultimately influence the success or yield of the attempted edit. Non-uniformity may occur, by way of example, due to the fast silicon removal rate by the assist chemistry which is typically injected into the FIB milling (etching) region. Often the detected non-uniformity is the result of a tilting of the floor of the trench due to the nature of the FIB chemical gas delivery injector.

It is believed that others in the field have not adequately recognized the significance of having such a uniform trench floor or at least of having its non-uniformity determined. This has been found by the present inventors to be a significant shortcoming of FIB trench etching processes. In addition to its importance in circuit editing accuracy, thickness uniformity of the trench floor is also critical for enabling accurate navigation by methods such as IR imaging navigation (as described by Talbot et al in U.S. Pat. No. 6,518,571) or voltage/materials contrast navigation, as described in U.S. patent application Ser. No. 10/789,336. In particular, voltage contrast navigation requires etching quite close to the active regions: therefore uniformity of the trench bottom to the die surface is even more important, so as not to damage the active regions. Potentially, as dimensions continue to decrease, milling down to the actual diffusions may be required to achieve sufficient navigation and editing accuracies, which will place even a more stringent requirement on uniformity of remaining substrate thickness.

SUMMARY OF THE INVENTION

According to the present invention, the trench formation process is modified to allow detection of thickness non-uniformity in the floor of the trench. This has been found to be especially useful with semiconductor devices having extremely small geometries, where the success of device circuit edits using a focused ion beam relies on high aspect ratio circuit edits. As described above for such editing from the backside of the semiconductor substrate, this requires trenching the silicon to within only a few microns of the circuitry. At that scale, the topography of the trench floor (its flatness) needs to be monitored accurately and one needs to be able to evaluate locally the surface quality for such high aspect ratio trenches.

During the trenching process using a focused ion beam and monitored by near infra-red imaging, interference fringes appear at the trench floor. Typically the optical observation for silicon substrates is in the waveband of 850 nanometers to 1050 nanometers, in the infra-red, with filter bandpass specifications typically about 70 nm, but while monitoring the absolute fringe contrast, where the contrast curve is the steepest, a narrow bandwidth filter is generally used, e.g., 10 nm bandwidth. The preferred wavelength for the purpose of yielding the best resolution, is the shortest wavelength which has good transmission through the substrate. However, some benefits occur from using longer wavelengths of 1100 nm or longer, since doped Si substrates have peak transmission at around 1100 nm.

A first subset of fringes are the optical result of reflections of the infra-red light from the trench floor interfering with reflections of the infra-red light from the silicon/dielectric interface. A second subset of fringes results from reflections from the trench floor interfering with reflections from the metal layers of the circuitry. The first subset of fringes forms a pattern which is associated with thickness variations of the trench bottom.

In the inventive method, these interference fringe patterns from the first subset of fringes are utilized to form a map of the thickness uniformity of the trench bottom. The fringes can be used in their raw form, or alternatively they may be enhanced by image processing techniques, such as a technique known as ODFM (optical digital fringe multiplication). This technique is described in the publication "Sensitivity Enhancement of Far-Infra-red Fizeau Interferometry By Digital Processing", Kaushal Verma, Bongtae Han, *Optical Engineering*, vol. 40 (9), September 2001, which is hereby incorporated herein by reference. From the information contained within the fringe density of the first subset of fringes, a quantitative map of the silicon thickness variations is obtained. Spacings between fringes indicate the change in thickness of the remaining silicon thickness from the trench floor to the active-ILD) interfaces, which indicates how parallel these interfaces are, even if absolute thickness cannot be determined. The closer the peak-to-peak fringe separation is, the more tilted the trench floor is relative to the active/ILD interface, or the less parallel these same interfaces are to each other.

Another aspect of the invention is the utilization of the interference fringe mapping to direct the FIB milling to those regions which are thicker, as per descriptions in earlier cited U.S. Pat. No. 5,616,921, i.e., to correct observed non-uniformities in the trench floor thickness by varying the pixel dwell time across the milled area. As this is a process of repeated comparisons, the thickness of the remaining substrate is not needed to obtain uniform thickness.

Another aspect of the invention is the use of the interference fringe mapping to develop computerized contour lines to automate the pixel dwell time variations as described above, for correcting non-uniformities in the trench floor thickness. This is an application of a technique known as "bit map milling".

Another aspect of the invention is the application of interference fringe mapping to applications other than trench formation for backside editing, such as monitoring progress in forming a milled object.

Use of the inventive technique may include utilizing image processing techniques to deconvolve the first and second fringe subsets, i.e., to separate the high frequency fringes which arise from reflections from the deeper circuitry from the lower frequency fringes which arise from the thickness variations in the trench floor.

It is to be understood that the inventive process and method are not limited to the typical silicon integrated circuit substrates but also can be extended to apply to other crystalline substrates used in semiconductors. By way of example, as the materials in semiconductor devices keep changing, the move to SOI (silicon on insulator) would mean that visible or even UV light can be used for monitoring thickness uniformity of the very thin silicon layer, rather than just the near IR mentioned herein. III-V and II-VI semiconductor substrates also have greater transparency at shorter wavelengths, with transmission up to the visible range. Further, to improve noise isolation substrate doping may be reduced, which will also yield grater transparencies at shorter wavelengths. The use of the shorter wavelength visible light in any of these cases would improve resolution.

Also, the particular injected chemistries and FIB ions disclosed herein and related parameters are merely exemplary.

It is also likely that electron beams can be used to trench Si, since it is known that XeF2 etches Si spontaneously, as described in H. F. Winter, J. W. Coburn, Surf. Sci. Rep. 14 (1992), 190, and Kunz, R. R., "*Chemical modification of surfaces via low-energy electron bombardment*", *PhD Thesis*, (1988) North Carolina Univ., Chapel Hill, N.C. USA, and that electron bombardment enhances the etching of materials by XeF2. The use of electron beam trenching will be significant when the final thickness of the trench floor needs to be very thin, since the amount of XeF2 can be reduced from the amounts used for spontaneous etching due to the electron beam enhancement, but without the amorphous damage caused by Ga ion beam enhancement and without the Ga implantation.

Further disclosed herein is an associated apparatus which includes a FIB tool in combination with an optical microscope and suitable controls as has been described in U.S. patent application Ser. No. 10/239,293 (French Patent # 2806527, granted Oct. 25, 2002).

DETAILED DESCRIPTION

Figure 7:
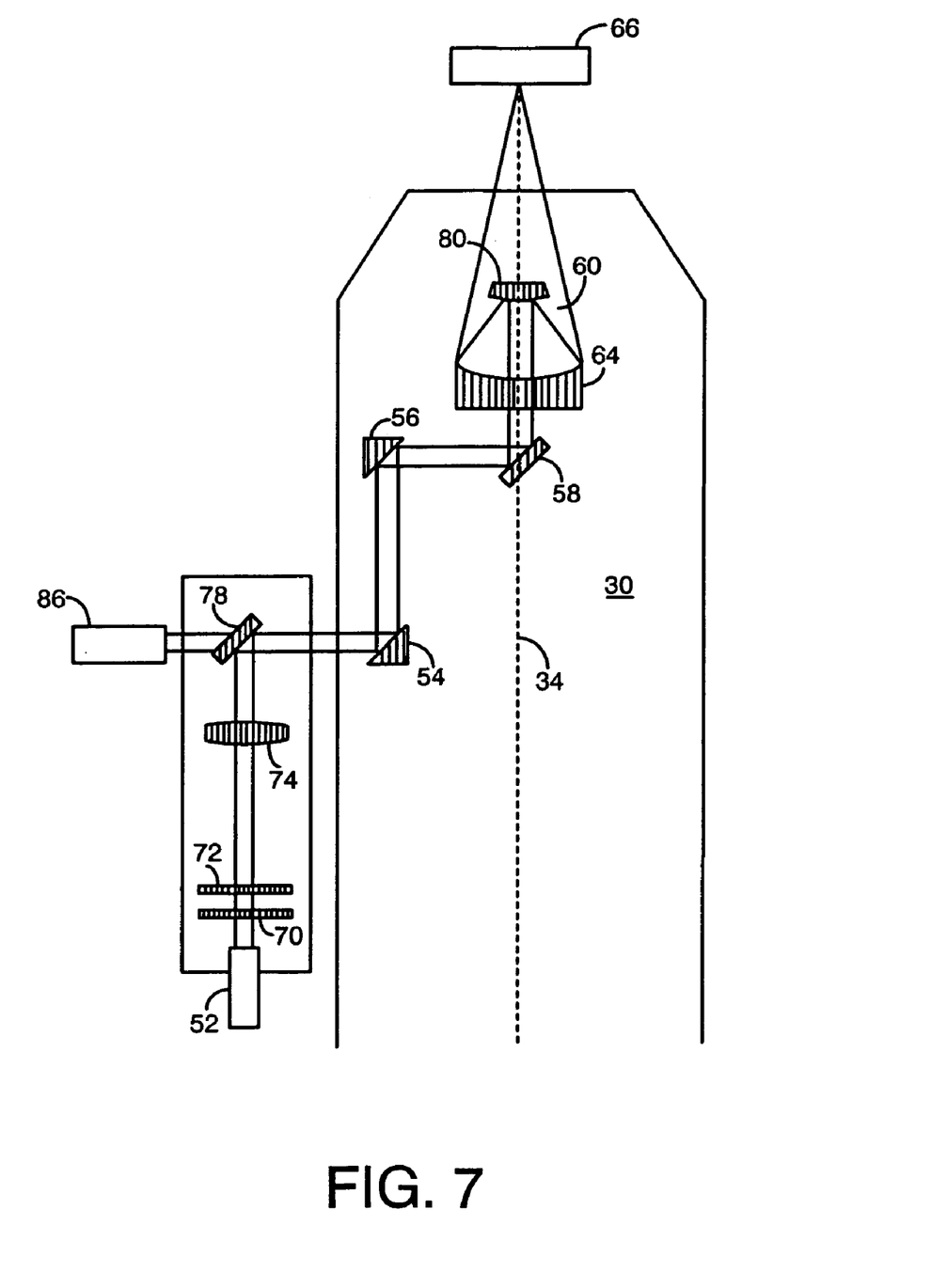
FIG. 7 shows details of the optical imaging system of FIG. 6.

For details of a FIB apparatus system useful in accordance with this disclosure, see previously cited U.S. Pat. No. 6,225,626. Conventional details of this apparatus and the accompanying well known FIB techniques for forming trenches are not included here except as shown in FIG. 7. Briefly, however, the FIB tool (apparatus) includes a source of ions, gallium ions in one example, a holder for the workpiece which is typically an integrated circuit from which the packaging has been at least partly removed, the FIB column which accelerates and focuses the ion beams onto the workpiece, an XY movable stage for moving the FIB column, a movable Z-stage onto which the workpiece and holder are mounted, suitable vacuum enclosures and controls, and conventional apparatus for injecting chemistry into the FIB under controlled circumstances to enhance the FIB etching. There is also an infra-red microscope for observing the process. In addition, the FIB column has an associated FIB imaging subsystem which detects secondary electrons ejected by the workpiece and provides a visual display of the resulting image for use by the operator. Hence, not only does this system provide an optical (e.g., infra-red) image, it also provides an electronic FIB image. Both of these images are displayed to the operator, typically on a video monitor.

Additional details of a typical FIB system are described in previously cited U.S. Pat. No. 5,140,164.

Other aspects of this process are disclosed in co-pending U.S. patent applications No. 10/160,606, entitled Method and Apparatus for Forming Trench Through a Semiconductor Substrate, inventors Erwan Le Roy and Mark A. Thompson, and Ser. No. 10/161,272, entitled Method and Apparatus for Determining Thickness of a Semiconductor Substrate at the Floor of a Trench, inventors Erwan Le Roy and Chun-Cheng Tsao, both incorporated herein by reference in their entireties, as well as U.S. application Ser. No. 10/789,336 by Erwan Le Roy and William Thompson, and U.S. application Ser. No. 10/159,527 by Madhumita Sengupta and Mamta Sinha. These disclosures pertain to other improvements to FIB trenching for circuit modification. It is to be understood that the present method may be accomplished using the above described FIB tools in combination with an optical microscope as known in the field or modifications or improvements thereto.

The process disclosed here is exemplary. It involves etching a trench in a silicon semiconductor crystalline substrate which is part of a fabricated integrated circuit, using a focused ion beam with gallium ions. The integrated circuit has been prepared so that the packaging is removed at least on the backside surface (or alternatively the IC is not packaged) and the IC is conventionally mounted on a z-stage movable in the Z (vertical) direction. Typically, a z-distance of 100–1000 µm is maintained between the end of the chemistry injecting tube and the working surface of the trench, and an x-y distance of 200–500 µm from the center, so that chemistry delivery is at the center of the FIB operational area. The distance from the FIB chemistry injector to the working surface of the trench is maintained constant by movement of the chemistry injector or the z-stage in the vertical (Z) direction. Also, the optical focus of the infra-red microscope is maintained on the trench floor by z-stage adjustment. Use of infra-red wavelengths is known for optical observation through crystalline silicon, as is described in previously cited U.S. Pat. No. 6,225,626. Typically the optical microscope has an associated infra-red light source which may be a broad spectrum lamp such as a xenon lamp, or may be a monochromatic source such as a 1064 nm laser, and may include a filter admitting the infra-red wavelengths at, e.g., 950 nanometers with a 70 nm bandwidth. A typical current of the FIB is 5–25 nanoAmp. An exemplary thickness of the silicon substrate prior to the trenching is 25–100 µm, although in certain non-ideal situations it can be much thicker due to adjacent structures.

Figure 1:
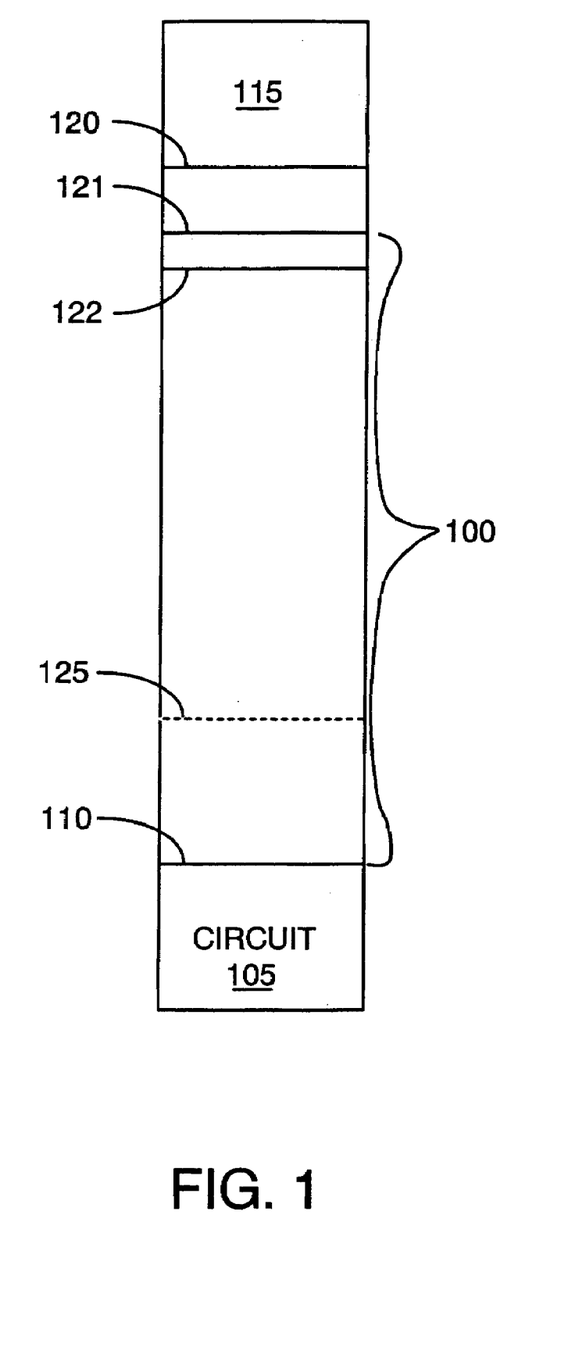
FIG. 1 shows graphically trench etching and optical observation of same in accordance with this disclosure.

FIG. 1 provides a graphical depiction of a trench etching process in cross-section in accordance with this disclosure. The vertical axis represents both the cross-section of an IC and also the passage of time during the etching process.

Anti-reflective Coating 115 is the global dielectric coating which improves imaging by improving the relative contrast. (An anti-reflective coating is not necessary to the process, but is included in the description since it does improve initial image quality). Surface region 120 is the silicon backside surface, which generally contains imperfections such as scratches or nicks, which are removed as described below by the Ga FIB beam without chemical assistance. The resulting implanted Ga is then removed as described below. The trench is etched/milled into doped silicon 100 using the Ga FIB beam with XeF2 assistance. The desired position for the trench bottom is shown as level 125. Dielectric-substrate interface 110 occurs at the wafer frontside. Dielectric layer 105 is the dielectric (SiO2 generally) upon which the interconnect structure is built.

The upper portion (100) of FIG. 1 represents the backside surface of the IC substrate (workpiece) and the bottom portion (105) labeled "circuit" represents collectively the various metal interconnection layers and the accompanying interlying dielectric layers conventionally formed on the principal surface of the actual IC substrate (die). That principal surface (110) occurs at the position which is labeled "thickness=0 mm". Prior to the depicted process of FIG. 1, the IC substrate (die) is either totally removed from its package, or the backside surface of the package is removed. The entire backside surface of the exposed IC die is then subject to lapping or polishing or milling using a conventional type machining tool of the type used in the semiconductor field, to render the entire backside surface as planar as possible with respect to the front surface.

After mounting, an anti-reflection (AR) coating (115) is conventionally formed on the exposed backside substrate surface (120). This coating is typically a silicon or hafnium oxide or a transparent spin-on organic material of suitable thickness. This AR coating is formed over the entire exposed backside surface and is provided in order to permit subsequent optical observations of the trenching process using the optical microscope.

With the AR coating present, the operator determines exactly where the trench is to be formed. Its size and location are determined with reference to the known IC circuit layout and in accordance with the actual intended work to be carried out on the IC such as metal layer editing. A typical trench is symmetric, with dimension of 50–250 µm. The cross-section of the focused ion beam is a very small circular area, much smaller than the size of the trench. A typical working cross section of the ion beam is 0.2 to 3 µm diameter. The FIB is raster scanned over the surface area of the trench in order to perform the actual etching. The first step in the trenching process, as depicted in FIG. 1, is removal of the AR coating at the area where the trench is to be formed. This AR removal uses the FIB beam with no assist (injected) gas so as to sputter the AR coating uniformly and not to cause pitting in the silicon as the AR coating is removed. Following AR removal, the actual (silicon) substrate surface (120) is exposed. At this point, an additional unassisted (no injected chemistry) FIB etch is used to smooth the exposed substrate surface. It is intended to normalize any surface defects initially present on the exposed substrate surface so as to have the working substrate surface as planar as possible. Typically, this smoothing step takes an additional six minutes for 100×100 µm surface area using a FIB current of 12–20 nanoAmps, and beam energy of 30 keV. Smoothed surface (121) is then exposed.

The unassisted FIB etching for removal of the ARC and for surface smoothing leaves a residual implanted ion layer (122) at the exposed silicon surface due to the incident ions (e.g., of gallium) from the FIB. It is then necessary to remove this implanted ion layer. This is done, again using the FIB, with an injected as such as ethylene-di-iodide (EDI), which is chosen to be less aggressive in attacking the material (e.g., silicon) of the substrate than is the gas later used to actually etch the trench. The purpose of this step is to reduce the thickness of the implanted ion layer without actually attacking the underlying non-implanted silicon to obtain a smooth substrate working face. Multiple cycles of the unassisted to EDI assisted etches are typically performed, with a ratio of 3–5 minutes unassisted to 1–2 minutes EDI assisted, until the surface defects are negligible and no anomalies are visible in the optical image. Any large residual defects can cause unfavorable trenching results when the XeF2 is introduced.

Following the reduction of the implanted ion layer thickness, the actual deep trenching is performed by the FIB gallium beam, generally assisted by a highly active assist chemistry such as XeF2. This is described by M. A. Thompson et al in *Coaxial, Photon-Ion Technology Enables Direct Navigation to Buried Nodes on Planarized Surfaces, including Silicon ISTFA* 2002. As shown on FIG. 1, the trench etch is stopped at point 125, which is about 2–4 microns from the principal surface 110 of the wafer.

At each step, the substrate working face is observed both optically using the IR optical microscope and/or using FIB imaging.

In the inventive process, interference fringe patterns are utilized to quantify, and form a map of, the uniformity of the silicon thickness at the trench floor. In one embodiment a known image processing technique called optical digital fringe multiplication (ODFM), as described in previously cited reference "Sensitivity Enhancement of Far-Infra-red Fizeau Interferometry By Digital Processing", Kaushal Verma, Bongtae Han, Optical Engineering, vol. 40 (9), September 2001, is used to enhance the visibility and resolution of the fringes.

The interference fringes first become visible in the infrared optical microscope when the remaining silicon thickness is on the order of 20–30 microns for near IR, for visible light it will probably be less. At that point, the first order fringes associated with reflections from the silicon-dielectric interface, i.e., the fringes correlated with the remaining silicon thickness, begin to appear, illustrated in FIG. 2a. The fringes 210 first appear at thicker remaining silicon thicknesses when wide bandpass (70 nm) filters are used. The contrast of the fringe is very faint and has a slow contrast response, which makes it difficult to visually endpoint based solely on fringe contrast. Therefore for endpointing a narrow band width filter, 950 nm filter with 10 nm bandwidth, is used. The contrast performance enables the fringes to first appear at a thinner remaining silicon thickness, typically 20 microns, and the contrast curve has a steeper linear region with a log response or very steep linear region at the very thin remaining silicon thickness of 5 microns. As the trenching continues, the second order fringes associated with reflections from deeper circuitry, generally first layer metal and polysilicon lines, begin to appear when the remaining silicon thickness is about 2.5–5 microns. FIG. 2b shows an example of second order circuitry fringes 250 superimposed on first order thickness fringes 260.

Figure 2A:
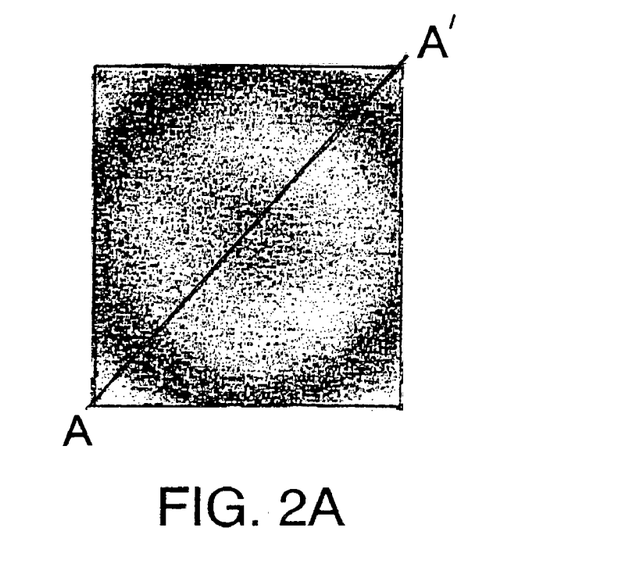
FIG. 2a shows an unprocessed fringe image.
Figure 2B:
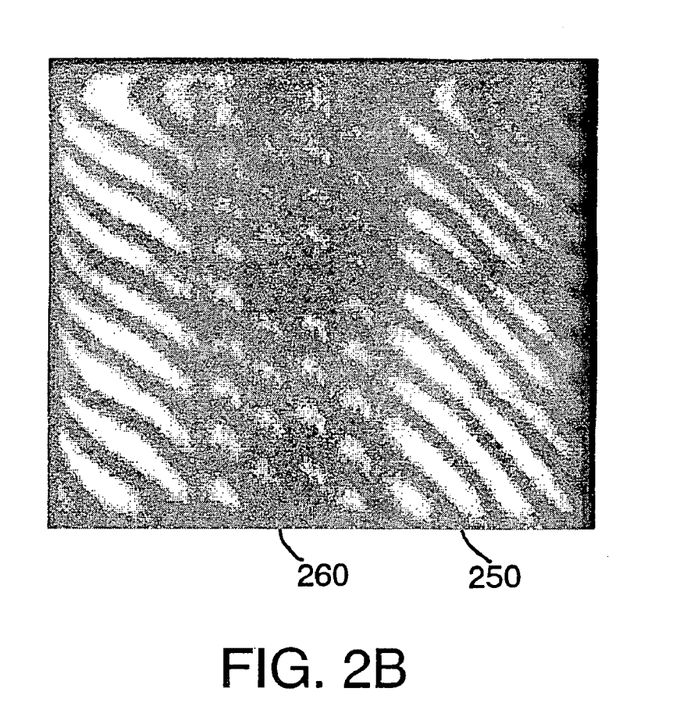
FIG. 2b shows a superposition of first order thickness fringes with second circuitry fringes.
Figure 3:
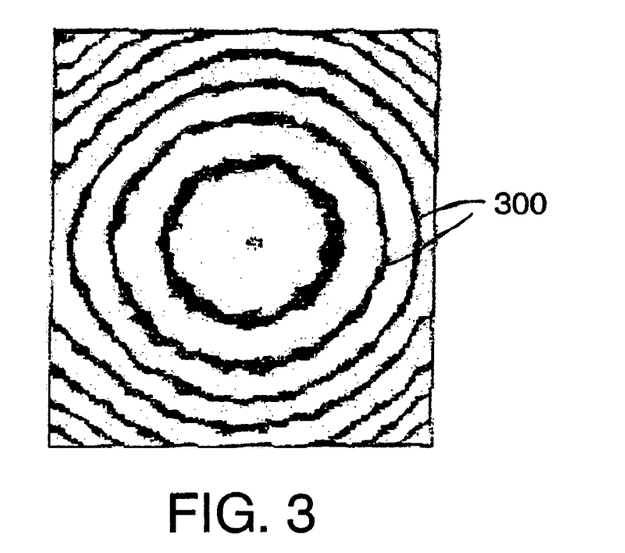
FIG. 3 illustrates the image of FIG. 2a after processing by the ODFM technique to enhance the fringe contours

The observed unprocessed first order fringe image in the optical microscope is illustrated in one example in FIG. 2a. FIG. 3 illustrates the image of FIG. 2a after processing by the ODFM technique to enhance the fringe contours. Each fringe contour line (300) is analogous to the contour line on a topographic map and here defines an equal thickness of the substrate. The distance d between fringe contour lines is indicative of the slope m of the thickness non-uniformity: Successive fringes appear at a spacing of $\lambda/2$ m. For example, if the wavelength of the light being used is 900 nanometers, and the slope is one, (i.e., the difference in thickness at two points on the trench bottom 1000 nm apart is 1000 µm), then the distance between successive fringes will be 450 nm across the trench bottom.

Figure 4:
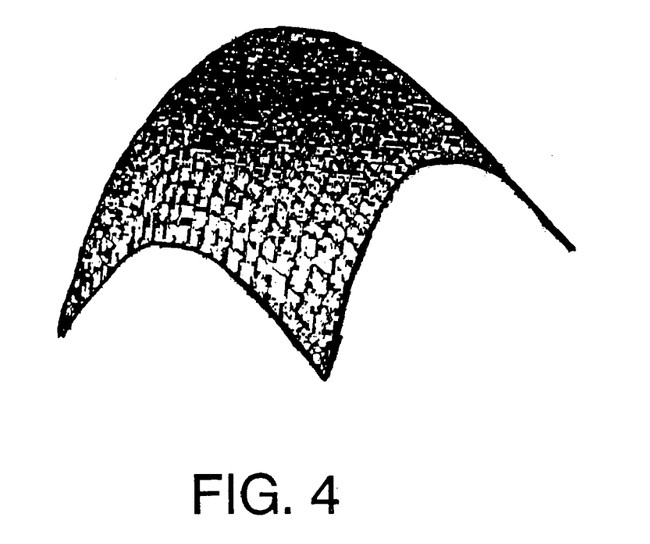
FIG. 4 shows a three-dimensional image showing the non-uniformity of the trench floor.

In the example shown in FIGS. 2 and 3 it is seen that the substrate defines either a bump or a depression, characteristic of non-uniformity. The contour map can be computerized as a three-dimensionsal image showing the non-uniformity of the trench floor in a more graphic fashion, as shown in FIG. 4. It is understood that the images of FIGS. 2, 3, and 4 are typically displayed on a video monitor connected to the computer which processes the images.

The thickness uniformity map can be utilized, according to an embodiment of the present invention, to improve or direct corrective milling operations so as to bring the trench bottom thickness to an acceptable level of uniformity. A first step in this process is to determine acceptable limits for non-uniformity for a given application. By way of example, for voltage/materials contrast FIB-to-CAD alignment, current preferred limits are no more than 4–8 first-order interference fringes across a routine area 200×200 micron trench floor, using 950 nm wavelength illumination with a narrow (e.g., 10 nm) bandpass filter. Non-uniformity from fringe peak to peak at this wavelength is approximately 475 nm, corresponding to a thickness non-uniformity of about 2–4 microns across the trench floor. A second step is to determine the extent and method of correction required.

An extreme amount of non-uniformity or a local uncontrollable pit formation in the area of interest due to, for example, a defect, may require abandonment of a trench if there is not sufficient remaining silicon thickness to correct the non-uniformity. However, the abandonment of a trench in actual practice is catastrophic as it means a device is scrapped. Therefore this approach would generally be routinely used only if a practice trench is provided. Accordingly, the corrective milling operation must be initiated sufficiently before the desired thickness is reached to enable the correction to be effective.

An embodiment of the invention uses manual optical inspection of the fringes on the trench image. From interpreting a series of images and observing the direction of fringe movement with time (fringes will first appear at the thinner edge and will "move" uphill), the user identifies to the software which side of the trench is the thicker side, which requires faster milling to even the trench bottom thickness. The milling software provides for a linear variation of the magnitude of the pixel dwell time (i.e., the FIB beam is stationary at a particular location for a particular dwell time, then discretely moves to the next location) for each line scan, as the scan progresses across the milled area. In other words, each pixel in a particular line of the scan has the same dwell time, but successive lines in the scan can have linearly decreased dwell times. Accordingly the milling software can be programmed to provide the longest dwell time to the side needing more milling. This process may, and often does, require a rotation of the sample relative to the scan during the milling, particularly if the thickest area is in a corner. This rotation can be accomplished by rotating the sample, or by rotating the "linear variation" scan direction.

The milling speed is not linearly proportional to the dwell time, due to the spontaneous etching by the XeF2 chemistry. This puts a limitation on the frame refresh time, i.e., the total time for one full scan to return to a starting pixel, which needs to be controlled and minimized. The other limitation on dwell time is that it should not cause sputtering instead of the ion induced chemical process. The ion beam must move fast enough to allow the chemical assist gas to be replenished on each pixel, i.e., too long a dwell time at each pixel could result in depletion of the available gas by the intense beam. Conversely, too short a dwell time would result in not achieving the maximum trenching. The ion beam speed is a direct function of frame refresh time of which dwell time is one component. Other components are the number of actual pixels and the retrace times of line and frame. The non-linearity of the milling speed is especially evident near the walls of a trench, where an edge effect occurs resulting in higher milling rates close to the walls. To counter this it is sometime (depending on the depth of the trench) necessary to decrease the dimensions of the milled area.

Other modifications can be made so as to accelerate the milling in some areas or reduce it in others. This can be done by adjusting certain combinations of the beam diameter, the blanking, or by rebalancing the ion current to chemistry flow rate. These parameters may also need to be adjusted across the scanned region.

Any excessive disparity in trench bottom thickness requires that the corrective process begin as soon as is feasible. Characterization from test samples or previously milled trenches can be utilized to initiate compensation in milling parameters such as dwell times from the beginning, but as the milling progresses and the fringes appear, the fringe monitoring can provide additional immediate feedback regarding the uniformity of the trench bottom thickness and thereby refine the compensation process.

The corrective milling operation must be initiated sufficiently before the desired thickness is achieved, in order to enable the correction to be effectively accomplished. The necessary start time for the correction process is dependent on the extent of the non-uniformity. In general, this occurs before the second-order circuitry fringes become visible, therefore it is not generally necessary to separate or deconvolve the two types of fringes. However, the capability to deconvolve the first order thickness fringes, which tend to be fairly uniformly spread across the trench bottom as shown in FIG. 2b, feature 250, from the second order circuitry fringes, which tend to be more localized as shown in FIG. 2b, feature 260, may be useful in some circumstances where milling thickness compensation continues down to small trench bottom thickness.

Another embodiment automates the dwell time adjustment for the milling according to the fringe map: The fringe contours are used to create a grayscale pixel map (i.e., "bitmap"), wherein grayscale corresponds to dwell time. This grayscale bitmap is then read by the milling instrument and the grayscale is converted into dwell times for the corresponding pixels. The dwell time is independent for each pixel, rather than being held constant for an entire scan line. Due to the non-linearity of the milling caused by the spontaneous etching by the XeF2 chemistry, this conversion is not necessarily a linear process, but can be obtained through experimental characterization. Further description of this method is found in previously cited U.S. Pat. No. 5,616,921 B1.

Figure 5:
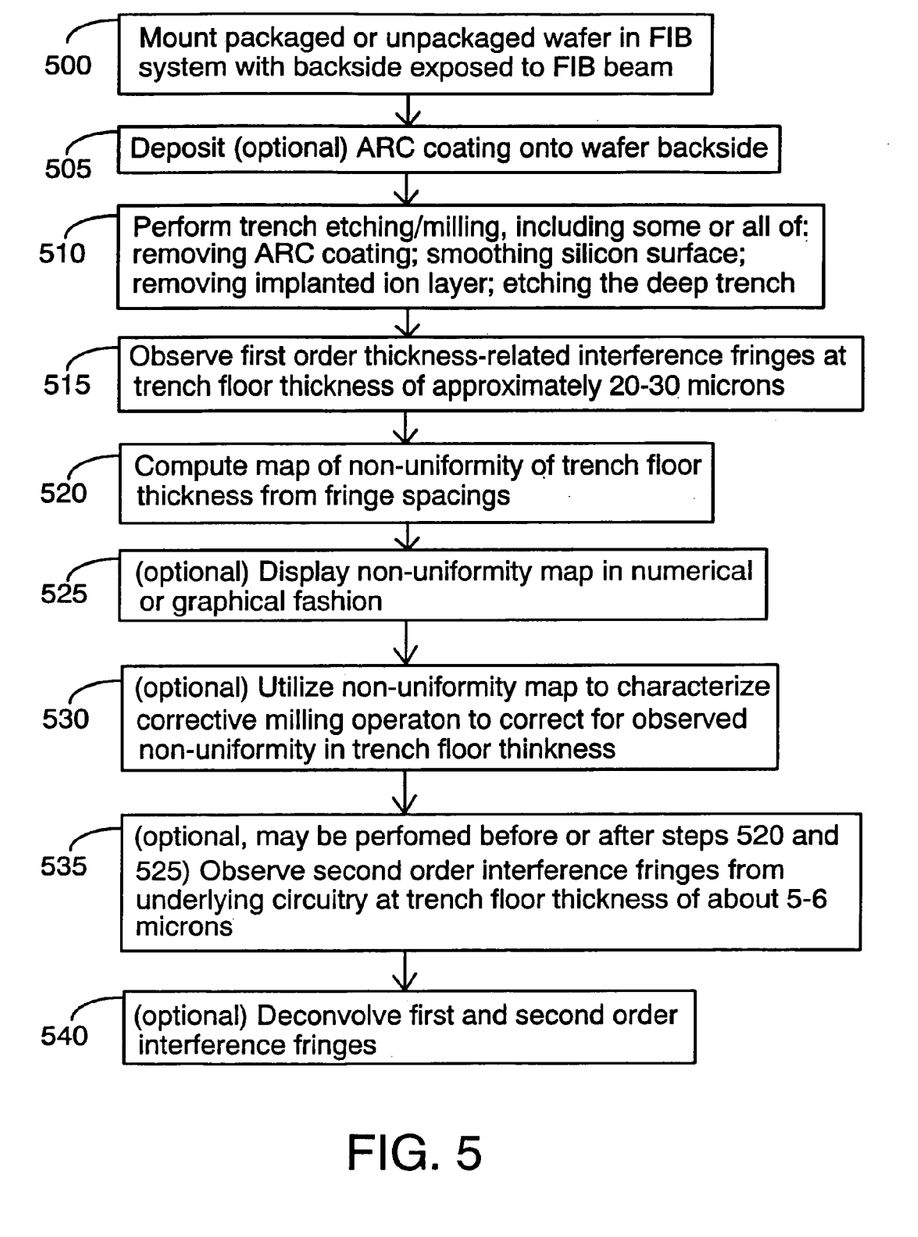
FIG. 5 is a flow chart of the present method.

FIG. 5 shows a flowchart of the present method. In step 500, the wafer (either unpackaged or with the packaging at least partly removed) is mounted in a FIB system including an infra-red optical microscope. The backside of the wafer is exposed to the FIB beam.

In step 505, an optional ARC coating is deposited onto the backside of the wafer.

In step 510, trench etching/milling is performed. This may be a multi-step process, which may include all or some of the steps of:
   a) removal of the ARC coating using unassisted FIB etch, thereby exposing the bare silicon backside;
   b) smoothing of the silicon surface using unassisted FIB etch;
   c) removing the implanted ion layer resulting from steps a) and b) using FIB etch with a less aggressive chemical assistance; and
   d) etching the deep trench utilizing an aggressive assist chemistry such as XeF2.

In step 515, first order thickness-related interference fringes are first observed when the trench floor thickness is approximately 20–30 microns.

In step 520, a map of the non-uniformity of the trench floor thickness is computed from the fringe spacings of the first order interference fringes.

In step 525, the non-uniformity map of step 520 is optionally displayed in numerical or graphical fashion.

In step 530, the non-uniformity map of steps 520 and 525 is optionally used to characterize a corrective milling operation to correct for observed non-uniformity in the trench floor thickness. This may be done manually by changing beam or milling parameters such as dwell time, or it may be automated to perform bitmap milling.

In step 535, which along with step 540 may be performed before or after steps 520 and 525, second order interference fringes from the underlying circuitry may be first observed when the trench floor thickness is approximately 5–6 microns.

In step 540, first and second interference fringes are optionally de-convolved from one another.

Figure 6:
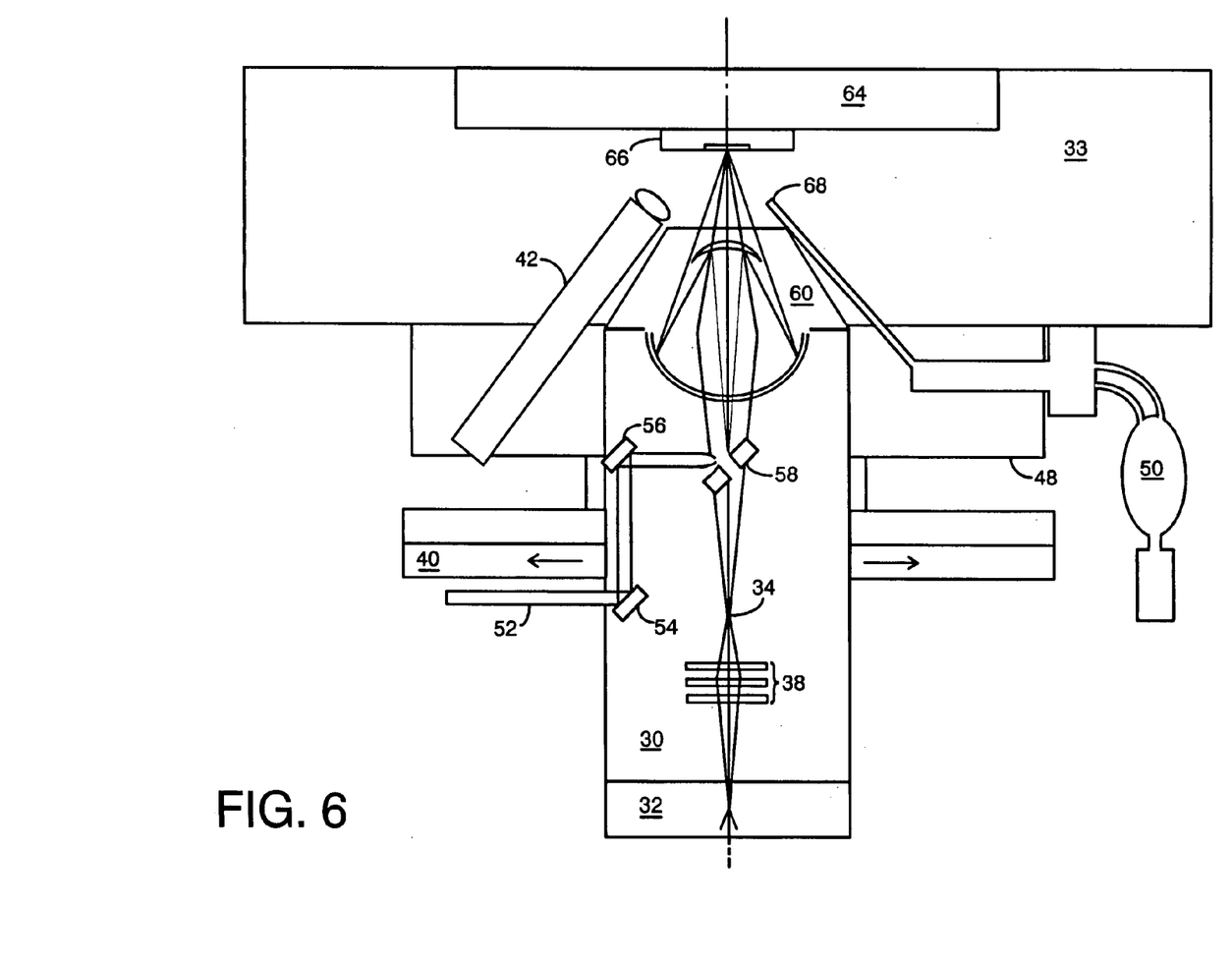
FIG. 6 shows in cross-section an apparatus used to carry out the present method.

FIGS. 6 and 7 show an apparatus used in accordance with this disclosure. This apparatus is capable of simultaneously observing the FIB etching of the workpiece using the conventional FIB electron imaging while observing the workpiece optically using the coaxial light microscope.

FIG. 6 shows in cross-section an apparatus used to carry out the above method. It is to be understood that the above method generally uses the understanding gained by the operator from observation of both the FIB image and the optical image to determine when each step in the etching process should be terminated. The FIG. 6 apparatus (which here is the commercially available IDS OptiFIB™ from Credence Systems) includes a conventional FIB column 30 having the ion source 32 and accelerating and focusing electrodes 38 and FIB imaging system (scintillator detector) 42. The ion beam 34 passes through the column 30. The column 30 is moved in the X and Y directions as indicated by the arrows by a precision XY stage 40. A sliding seal 48 is provided between the ion beam column 30 and the sample chamber 33. The sliding seal 48 provides the necessary environmental protection since the interiors of the chamber 33 and column 30 are typically at vacuum. Also provided is the FIB chemistry injection system which has conventional elements including reservoirs, piping and valves 50 and which terminates at the chemistry injector tip 68. The light optical imaging system includes an optical fiber 52 which introduces the light which is then reflected (as free space light) after entering the column 30 by mirrors 54 and 56 and 58 down through the photon-ion objective lens 60. The ion beam and light beam are co-incident on the device under test (DUT) 66 which rides on a Z (vertical movement) stage 64. Stage 64 brings the device under test 66 (typically an integrated circuit) to the focus plane of the light optics. A typical distance between the tip of the photon-ion objective lens 60 and the top surface of the device under test 66 is 14 mm. The chemistry injection system 50 and the secondary electron detector 42 are in the same subsystem as is the column 30 so as to be fixed relative to the ion beam and light beam axes.

FIG. 7 shows details of the optical imaging system of FIG. 6. Elements in FIG. 7 which are the same as in FIG. 6 have the same reference numbers. Additional detail shown in FIG. 7 includes the light diffuser 70, light filter 72, lens 74, and beam splitter 78. Also shown is the optical objective lens 64 and a second optical lens 80. The optical imaging for the user is provided by any one of many possible detection devices. In one embodiment, a charge coupled device (CCD) 86 receives the light reflected back up from the device under test 66 via mirrors 58, 56, and 54 and back through beam splitter 78. The charge coupled device 86 is typically connected electrically to a computer to provide the optical image onto a conventional computer monitor. Other detection methods include focal plane arrays such as mercury-cadmium-teluride or indium gallium arsenide detectors.

The present invention provides a method of determining non-uniformity of a trench floor thickness during formation of a trench in a semiconductor substrate by FIB milling. This is accomplished by using image processing of interference fringes which can yield a map of the uniformity of the semiconductor thickness at the trench floor. This map can be utilized to correct for the non-uniformities and thereby improve backside circuit edit capabilities.

Another application of the interference fringe thickness non-uniformity maps of the present invention is monitoring progress in forming a milled object. To mill an object in a thin (<30 micron thickness) semiconductor material, the desired thickness profile would need to be calculated in advance. The IDS OptiFIB instrument enables bit map images to be read and the grayscale converted into dwell times for the milling. The CAM (computer aided machining) program used to produce the desired shape would provide the detailed milling pattern/instructions such as in the bitmap milling formalism mentioned and it would also predict the relative interference fringe pattern that the shape would generate. By comparing the predicted interference pattern to the measured interference pattern continuous feedback of progress would be provided. Any other method of monitoring progress would not enable a topdown viewing without tilting the device (such as in a dual column ion/electron system). Note that the FIB itself would not be desirable for the monitoring as it would be machining, implanting and essentially modifying the surface while monitoring. Examples of uses for this method include construction of optical structures such as lenses (including solid immersion lenses), prisms, mirrors etc. Because of the aforementioned non-linearities in the dwell time vs. milling rate due to spontaneous etch, the bitmap would be deconvolved from the actual linear grayscale image so as to better specify how the milling is to proceed. A new bitmap could be downloaded in realtime based on the last image of the interference fringes. Since the fringe spacing itself is a function of depth, N×N sized pixel squares in the optical image could be converted to a new dwell value for those pixels. There is additional information about the change of "depth" in the direction and speed of the fringes which could be measured using the image processing techniques. One possible way is to binarize the image using the average intensity and then measure non zero values of the differentials in several directions. The direction which has the largest number of non-zero values represents the number of fringes for that sub-image. How these values change between adjacent sub-images over a period of time would represent the "speed" of fringe movement.

This disclosure is illustrative and not limiting; further modifications will be apparent to one skilled in the art in light of this disclosure in or intended to fall within the scope of the appended claims.

In the claims:

1. A method for, during formation of a trench a portion of the way through a semiconductor substrate sample from a first substrate surface to a second substrate surface, said trench having a trench floor, said trench floor having a thickness profile relative to said second substrate surface, determining the uniformity of said thickness profile, comprising the steps of:
    a) optically observing thickness non-uniformity-related interference fringes at said trench floor during trench formation;
    b) determining and quantifying the thickness non-uniformity across said trench floor from said observation of said interference fringes, by at least one of 1) determining thicknesses at multiple points, and 2) guanatitatively determining the slope of said trench floor at at least one location:
    c) forming a map of the thickness profile across the trench floor:
    thereby enabling compensating for said thickness non-uniformity.

2. The method of claim 1, further comprising the step of compensating for observed non-uniformity of said thickness profile during subsequent trench formation to improve said uniformity.

3. The method of claim 2, wherein said steps of optically observing thickness non-uniformity-related interference fringes at said trench floor during trench formation; and
    determining and quantifying the thickness non-uniformity across said trench floor from said observation of said interference fringes
    are personnel by manual optical inspection of the fringes on the trench image;
    and wherein the step of compensating for observed non-uniformity of said thickness profile during subsequent french formation to improve said uniformity is performed by adjusting parameters of subsequent wench formation according to said optical observation of said thickness non-uniformity-related interference fringes at said french floor.

4. The method of claim 3, wherein said trench is formed by FIB milling and wherein said adjusting of parameters of subsequent trench formation comprises adjusting milling dwell times so as to provide the longest dwell time to the side of the french needing more milling.

5. The method of claim 4, wherein said FIB milling is scanned linearly across the sample, and wherein the step of adjusting milling dwell times so as to provide the longest dwell time to the side of the trench needing more milling comprises rotating the sample relative to the scan.

6. The method of claim 3, wherein said french is formed by FIB milling and wherein said adjusting of parameters of subsequent trench formation comprises adjusting at least one parameter chosen from the group consisting of: beam diameter, beam blanking, and ion current to chemistry flow rare ratio.

7. The method of claim 1, wherein said trench is formed by FIB milling.

8. The method of claim 7, wherein said FIB milling is chemically assisted.

9. The method of claim 8, wherein said semiconductor substrate sample is silicon, and wherein said FIB milling is chemically assisted by XeF2 directed at said substrate during FIB milling.

10. The method of claim 1 wherein said step of forming a map of thickness non-uniformity comprises forming a computerized thickness contour map.

11. The method of claim 10, wherein said contour map is displayed as a graphical three dimensional image.

12. The method of claim 10, further including the step of enhancing fringe contours of said computerized thickness contour map using an image processing technique.

13. The method of claim 12, wherein said image processing technique is optical digital fringe multiplication (ODEM).

14. The method of claim 10, wherein said trench is formed by FIB milling with a computerized milling instrument utilizing a FIB beam, and wherein said FIB milling includes said FIB beam dwelling at a sequence of locations, each location comprising a pixel, for a dwell time;

said method further comprising the step of using said computed zed thickness contour map to create a grayscaic pixel map.

15. The method of claim 14, further including the steps of:

compensating for observed non-uniformity of said thickness profile during subsequent trench formation to improve said uniformity, by said computerized milling instrument reading said grayscale pixel map, and convening said grayscale pixel map into an independently determined dwell time for each pixel according to said computerized thickness contour map.

16. A method for monitoring progress in milling a FIB milled object in a thin semiconductor material, said abject having a desired thickness profile, comprising the steps of:

a. calculating said desired thickness profile before beginning milling of said object;

b. calculating detailed milling pattern and instructions including pixel dwell times according to said desired thickness profile;

using said desired thickness profile to calculate a corresponding desired non-uniformity interference fringe pattern;

d. during milling of said object, measuring and observing the actual non-uniformity interference fringe pattern generated by the object; and e. comparing said actual non-uniformity interference fringe pattern with said desired non-uniformity interference fringe pattern;

to enable compensating for deviations from optimal progress toward said desired interference fringe pattern during subsecuent milling, so as to mill said object to said desired thickness profile.

17. The method of claim 16, wherein steps d and e are repeated multiple times during said milling.

18. The method of claim 16, further including the step of compensating for any observed deviation from optimal progress toward said desired non-uniformity interference fringe pattern during subsequent milling.

19. The method of claim 18, wherein said step of compensating for any observed deviation from optimal progress toward said desired interference fringe pattern during subsequent milling comprises calculating modified milling instructions including generating new pixel dwell times.

* * * * *